(12) United States Patent
Müller

(10) Patent No.: US 10,978,129 B1
(45) Date of Patent: Apr. 13, 2021

(54) MEMORY CELL, MEMORY CELL ARRANGEMENT AND METHODS THEREOF

(71) Applicant: Ferroelectric Memory GmbH, Dresden (DE)

(72) Inventor: Stefan Müller, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 16/930,126

(22) Filed: Jul. 15, 2020

(51) Int. Cl.
| | | |
|---|---|---|
| G11C 11/22 | (2006.01) | |
| H01L 27/1159 | (2017.01) | |
| H01L 29/78 | (2006.01) | |

(52) U.S. Cl.
CPC ........ *G11C 11/2275* (2013.01); *G11C 11/223* (2013.01); *H01L 27/1159* (2013.01); *H01L 29/78391* (2014.09)

(58) Field of Classification Search
None
See application file for complete search history.

(56) References Cited

U.S. PATENT DOCUMENTS

| | | | | |
|---|---|---|---|---|
| 6,825,517 B2 * | 11/2004 | Dimmler | ............... | H01L 29/792 257/295 |
| 9,818,468 B2 | 11/2017 | Muller | | |
| 10,424,379 B2 * | 9/2019 | Slesazeck | ......... | H01L 29/40111 |

OTHER PUBLICATIONS

Book:"Development of HfO2-Based Ferroelectric Memories for Future CMOS Technology Nodes" ISBN-10 3739248947, Fig.1-6 on p. 9, https://books.google.de/books?id=ZCT8CwAAQBAJ &printsec=copyright&redir_e.
T. P. Ma and Jin-Ping Han, "Why is nonvolatile ferroelectric memory field-effect transistor still elusive?," in *IEEE Electron Device Letters*, vol. 23, No. 7, pp. 386-388, Jul. 2002, doi: 10.1109/ LED.2002.1015207.https://doi.org/10.1109/LED.2002.1015207.

\* cited by examiner

*Primary Examiner* — Tan T. Nguyen
(74) *Attorney, Agent, or Firm* — Hickman Becker Bingham Ledesma LLP; Malgorzata A. Kulczycka

(57) ABSTRACT

A memory cell is provided that may include: a field-effect transistor structure including a channel and a gate structure disposed adjacent to the channel, the gate structure including: one or more remanent-polarizable layers, a gate electrode, wherein the one or more remanent-polarizable layers are disposed between the gate electrode and the channel, and one or more charge storage structures disposed between at least one of the one or more remanent-polarizable layers and the channel and/or the one or more remanent-polarizable layers and the gate electrode, the one or more charge storage structures are configured to stabilize a polarization state associated with the one or more remanent-polarizable layers by trapping charge in the one or more charge storage structures.

20 Claims, 7 Drawing Sheets

US 10,978,129 B1

MEMORY CELL, MEMORY CELL ARRANGEMENT AND METHODS THEREOF

TECHNICAL FIELD

Various aspects relate to a memory cell, a memory cell arrangement, and methods thereof, e.g. a method for operating a memory cell or memory cell arrangement.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g. for writing (e.g. programming and/or erasing) and/or reading the respective memory cell or groups of memory cells. Therefore, various driver schemes may be used to implement a desired addressing scheme for a plurality of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
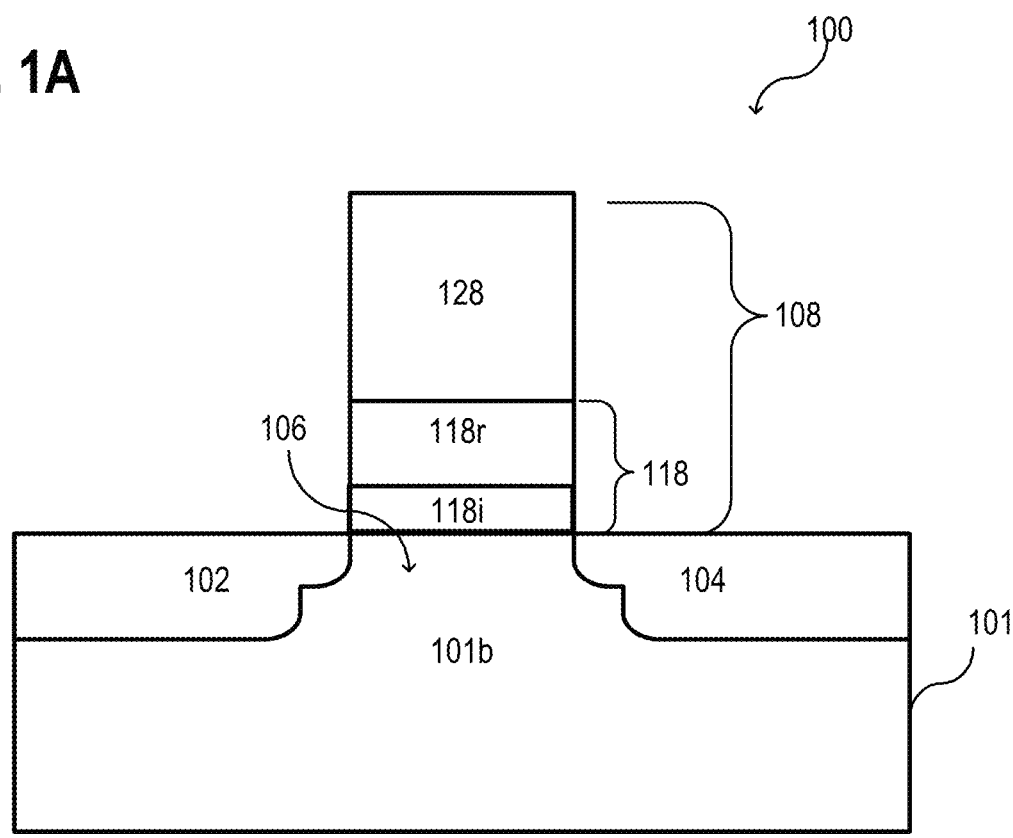
FIGS. 1A to 1F schematically shows a memory cell and electrical properties thereof.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g. arrangements). However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term "voltage" may be used herein with respect to "one or more write voltages", "one or more readout voltages", "one or more gate voltages", "a base voltage", "one or more source/drain voltages", and the like. As an example, the term "gate voltage" may be used herein to denote a voltage that is provided to a gate node or a gate terminal of a transistor or a memory cell, as examples. As another example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "source/drain voltage" may be used herein to denote a voltage that is provided to a source/drain node or a source/drain terminal of a transistor or a memory cell, as examples.

Illustratively, a voltage provided to anode may assume any suitable value depending on the intended operation of the circuit including the node. For example, a gate voltage (referred to as $V_G$) may be varied depending on the intended operation of a transistor or a memory cell. Analogously, a source voltage (referred to as Vs) and/or a drain voltage (referred to as $V_D$) may be varied depending on the intended operation of a transistor or a memory cell. A voltage provided to a node may be defined by the respective potential applied to that node relative to the base voltage (referred to as Vs) of the circuit. Further, a voltage drop associated with two distinct nodes of a circuit may be defined by the respective voltages/potentials applied at the two nodes. As an example, a gate-source voltage drop associated with a gate structure (e.g. of a transistor or a memory cell) may be defined by the respective voltages/potentials applied at the corresponding gate node and source node of the gate structure. The gate-source voltage drop may also be referred to as gate-source voltage, $V_{GS}$. In the case that the source voltage is zero, as used for example in conventional driving schemes for writing and/or reading of a field effect transistor based memory cell, the gate-source voltage drop and the gate-source voltage, $V_{GS}$, may be referred to as gate voltage, $V_G$.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g. of a voltage pulse) are considered for the comparison. As an example, an n-type or p-type field-effect transistor (FET) based memory cell may have a first threshold voltage, also referred to as low threshold voltage ($V_{L-th}$), and a second threshold voltage, also referred to as high threshold voltage ($V_{H-th}$). In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g. the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g. the $V_{L-th}$ may be −1 V and the $V_{H-th}$ may be 1 V, or the $V_{L-th}$ may be −2 V and the $V_{H-th}$ may be 0 V, or the $V_{L-th}$ may be −3 V and the $V_{H-th}$ may be −1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g. the $V_{L-th}$ may be −1 V and the $V_{H-th}$ may be −3 V, only as numerical examples), or the high threshold voltage, $V_{H-th}$, may be lower than the low threshold voltage, $V_{L-th}$, only with respect to the voltage value (e.g. the $V_{L-th}$ may be 1 V and the $V_{H-th}$ may be −1 V, or the $V_{L-th}$ may be 2 V and the $V_{H-th}$ may be 0 V, or the $V_{L-th}$ may be 3 V and the $V_{H-th}$ may be 1 V, only as numerical examples).

According to various aspects, a threshold voltage of a field-effect transistor or a field-effect transistor based memory cell may be defined as a constant-current threshold voltage (referred to as $V_{th(ci)}$). In this case, the constant-current threshold voltage, $V_{th(ci)}$, may be a determined gate-source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g. 0.1 µA with a driving voltage of 100 mV. In some aspects, the constant-current threshold voltage, $V_{th(ci)}$, may be determined based on the following equation:

$$V_{th(ci)}=V_{GS}(\text{at } I_D=I_{D0}\cdot W/L).$$

A threshold voltage of a field-effect transistor or a field-effect transistor based memory cell may be defined by the properties of the field-effect transistor or of the field-effect transistor based memory cell (e.g., the materials, the doping, etc.), and it may thus be a (e.g. intrinsic) property of the field-effect transistor or of the field-effect transistor based memory cell.

According to various aspects, a memory cell may have at least two distinct states associated therewith, for example with two distinct electrical conductivities that can be determined to determine in which of the at least two distinct states the memory cell is residing in. A FET based memory cell (e.g., a remanent-polarizable memory cell) may include a first memory state, for example a low threshold voltage state (referred to as LVT state), and a second memory state, for example a high threshold voltage state (referred to as HVT state). The high threshold voltage state may be, in some aspects, associated with a lower current flow during readout than the low threshold voltage state. The low threshold voltage state may be an electrically conducting state (e.g. associated with a logic "1") and the high threshold voltage state may be an electrically non-conducting state or at least less conducting than the low threshold voltage state (e.g. associated with a logic "0"). However, the definition of the LVT state and the HVT state and/or the definition of a logic "0" and a logic "1" may be selected arbitrarily. Illustratively, the first memory state may be associated with a first threshold voltage of the FET based memory cell, and the second memory state may be associated with a second threshold voltage of the FET based memory cell.

According to various aspects, writing a memory cell or performing a write operation of a memory cell may include an operation or a process that modifies the memory state the memory cell is residing in from a (e.g. first) memory state to another (e.g. second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing n-type FET based memory cell may modify the state the memory cell is residing in from the LVT state to the HVT state, whereas erasing a p-type FET based memory cell may modify the state the memory cell is residing in from the HVT state to the LVT state. As an example, the programmed state may be an electrically conducting state (e.g. associated with a logic "1") and the erased state may be an electrically non-conducting state or at least less conducting than the programmed state (e.g., associated with a logic "0"). However, the definition of programmed state and erased state may be selected arbitrarily.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on at least one ferroelectric field-effect transistor (FeFET). As an example, a memory cell may include a field-effect transistor (FET) structure having a ferroelectric material as a gate insulator. As another example, a memory cell may include a field-effect transistor structure and a ferroelectric capacitor structure coupled to a gate electrode of the field-effect transistor structure to provide a ferroelectric field-effect transistor (FeFET) structure. Since a ferroelectric material may have at least two stable polarization states, it may be used to shift a threshold voltage of a field-effect transistor in a non-volatile fashion; therefore, it may be used to turn the field-effect transistor into a non-volatile field-effect transistor based memory structure. According to various aspects, a FeFET or a FeFET based memory cell may be considered as a field-effect transistor based memory cell that stores data by means of a ferroelectric material in the gate stack. According to various aspects, a non-volatile field-effect transistor based memory structure or memory cell may store data for a period of time from hours (e.g. more than 5 hours) to several tens of years (e.g. 10 years, 20 years, etc.), whereas a volatile field-effect transistor based memory structure or memory cell may store data for a period of time from nanoseconds to hours (e.g. less than 5 hours).

In comparison to other emerging memory technologies, a FeFET memory cell or a FeFET based memory cell may be integrated in the Front-End-of-Line (FEoL) and/or in the Back-End-of-Line (BEoL) process flow, since it may be implemented as a transistor-type of memory. Accordingly, the integration of the FeFET memory cell or a FeFET based memory cell may comply with a standard FEoL and/or BEoL complementary metal-oxide-semiconductor (CMOS) process flow. Consequently, various integration schemes may be used to integrate a FeFET or a FeFET based memory cell in different process technologies, e.g., gate-first technologies, gate-last technologies, fully-depleted silicon-on-insulator (FDSOI) technologies, Fin-FET technologies, nanosheet technologies, nanowire technologies, as examples.

According to some aspects, a FeFET based memory cell may include, for example, a single FeFET structure or a plurality of (e.g. two) FeFET structures. This may allow for an implementation of a ternary memory cell, e.g. a content-addressable memory (CAM) cell. A ternary memory cell may be based on one or more FeFET structures and, therefore, may be integrated together with one or more logic transistors in a CMOS process flow. The integration of one or more FeFET based memory cells on a CMOS process platform may be carried out in a gate-first process technology. However, FeFET based memory cells may be implemented into other process technologies, wherein different integration schemes may be used. The FeFET based memory cells may be integrated, for example, next to one or more logic circuit structures, e.g., next to one or more processor cores on a chip. However, the FeFET based memory cells may be integrated independently from other structures. According to various aspects, a FeFET memory cell or a FeFET based memory cell may be provided with a feature size equal to or less than about 45 nm.

According to various aspects, a ferroelectric material may be used as part of a memory cell. The term "ferroelectric" may be used herein, for example, to describe a material that shows a hysteretic charge voltage relationship (Q-V). The ferroelectric material may be or may include ferroelectric $HfO_2$. Ferroelectric $HfO_2$ may include any form of hafnium oxide that may exhibit ferroelectric properties. This may include, for example, $ZrO_2$, $HfO_2$, a solid solution of $HfO_2$ and $ZrO_2$ (e.g. but not limited to it a 1:1 mixture), $ZrO_2$ or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide. According to various aspects, a ferroelectric material may be an example of a material used in a remanent-polarizable layer. According to various aspects, a ferroelectric layer may be an example of a remanent-polarizable layer.

Various aspects may be related to a remanently-polarizable layer (also referred to as remanent-polarizable layer) as memory layer or as a functional part of a memory cell. In general, a remanent polarization (also referred to as retentivity or remanence) may be present in a material layer in the case that the material layer may remain polarized upon reduction of an applied electric field, E, to zero; therefore, a certain value for the electrical polarization, P, of the material layer may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Further, the terms "spontaneously polarized" or "spontaneous polarization" may be used herein, for example, with reference to the polarization capability of a material beyond dielectric polarization. The coercivity of a material may be a measure of the strength of the reverse polarizing electric field that may be required to remove a remanent polarization. According to various aspects, an electric coercive field, $E_C$, (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

In general, a memory cell arrangement may include a plurality of (e.g. volatile or non-volatile) memory cells, which may be accessed individually or in blocks, depending on the layout of the memory cell arrangement and/or the corresponding addressing scheme. For example, in a field-effect transistor (FET) based memory cell arrangement, the memory cells may be arranged in a matrix architecture (A(n,m)) including columns, for example a number n of columns, and rows, for example a number m of rows, with n and m being integer numbers greater than one. In the matrix architecture, each memory cell may be connected to control-lines (e.g. to one or more word-lines, to a bit-line, and to a source-line), which may be used to supply voltages to the memory cells for performing writing operations and readout operations. The matrix architecture may be, for example, referred to as "NOR" or "NAND" architecture, depending on the way neighboring memory cells are connected to each other, i.e. depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g. source and drain regions are shared by neighboring transistors), and the string is connected to a bit-line and a source-line. For example, groups of memory cells in a NAND architecture may be connected in series with one another. In a NOR architecture the memory cells may be connected in parallel with one another, for example each memory cell of a column may be connected to a different source-line and may share the same bit-line with the one or more other memory cells in the same column. A NAND architecture may thus be more suited for serial access to data stored in the memory cells, whereas a NOR architecture may be more suited for random access to data stored in the memory cells.

Various aspects are related to a memory cell arrangement including one or more memory cells. The one or more memory cells may be, for example, one or more field-effect transistor (FET) based memory cells. In some aspects, a control circuit may be configured to carry out and/or instruct one or more write operations associated with a writing of one or more memory cells of the memory cell arrangement. In some aspects, a control circuit may be used to control a writing of a single memory cell of the memory cell arrangement (illustratively, a memory cell that is intended to be written). In some aspects, a control circuit may be used to control a writing of all the memory cells in a same row of memory cells (e.g., all memory cells having a node connected to a common word-line). According to various aspects, writing a memory cell may include bringing the memory cell from one of at least two memory states into another one of the at least two memory states of the memory cell (e.g., from the LVT state into the HVT state, or vice versa).

FIG. 1A illustrates schematically a memory cell 100. A memory cell (e.g., memory cell 100) may be configured as a field-effect transistor (FET) based memory cell. To realize a field-effect transistor function, the memory cell 100 may include a channel 106. The channel 106 may be provided by one or more semiconductor portions, e.g., within a bulk region of semiconductor substrate 101 or within a semiconductor layer, only as examples. The channel 106 may be disposed between at least a first source/drain region 102 and a second source/drain region 104. The channel 106 and the source/drain regions 102, 104 may be formed, e.g., via doping one or more semiconductor materials or by the use of intrinsically doped semiconductor materials, within a layer and/or over a layer.

Furthermore, the memory cell 100 may include a gate structure 108. The gate structure 108 may be configured to allow for a control of one or more electrical properties (e.g., an electrical resistance, e.g., a charge carrier density, e.g., a source/drain current through the channel in the case that a voltage is applied between the two source/drain regions 102, 104, only as examples) of the channel 106. Illustratively, the gate structure 108 may be configured to allow for a selective switching of the field-effect transistor into at least two different states (e.g., on and off). The gate structure 108 may include at least a gate-isolation 118 and a gate electrode 128, according to various aspects. The gate-isolation 118 and the gate electrode 128 may be configured to provide an electric field in the channel 106 and/or to modify an electric field that is present in the channel 106. The electric field that is provided/present in the channel 106 may define the one or more electrical properties of the channel 106. In some aspects, the gate electrode 128 may include or may consist of one or more electrically conductive layers. The one or more electrically conductive layers may include polysilicon, amorphous silicon, a metal (e.g. TiN, TaN) only as examples. In some aspects, the gate-isolation 118 may include or may consist of one or more electrically insulating layers 118i. The one or more electrically insulating layers 118i may include or may consist of $SiO_2$, SiON, and/or SiN, only as examples.

In some aspects, the gate-isolation 118 may include or may consist of one or more memory elements to implement a memory function. The one or more memory elements may be configured to modify the one or more electrical properties (e.g., the electrical resistance, e.g., the charge carrier density, e.g., the source/drain current through the channel) of the channel 106 as a function of at least two memory states of the one or more memory elements.

As schematically illustrated in FIG. 1A, the gate-isolation structure 118 may include one or more remanent-polarizable layers 118r forming a memory element of the memory cell 100. The one or more remanent-polarizable layers 118r may include or may consist of a remanent-polarizable material, e.g., ferroelectric $HfO_2$, e.g., ferroelectric $ZrO_2$, only as examples. It may be noted that, in the case that a remanent-polarizable layer is included in a gate-isolation structure of a field-effect transistor based memory cell, the memory cell may be referred to as FeFET-(ferroelectric field-effect transistor)-based memory cell (also referred to as FeFET cell or—in short form—as FeFET). A gate structure 108 of a FeFET together with the channel 106 and/or a portion of the semiconductor bulk region 101b including the channel 106 may be also referred to as FeFET stack.

According to various aspects, the FeFET stack of a FeFET based memory cell may be described as series connection of a two capacitors, as explained in more detail below with reference to FIG. 1B.

Figure 1B:
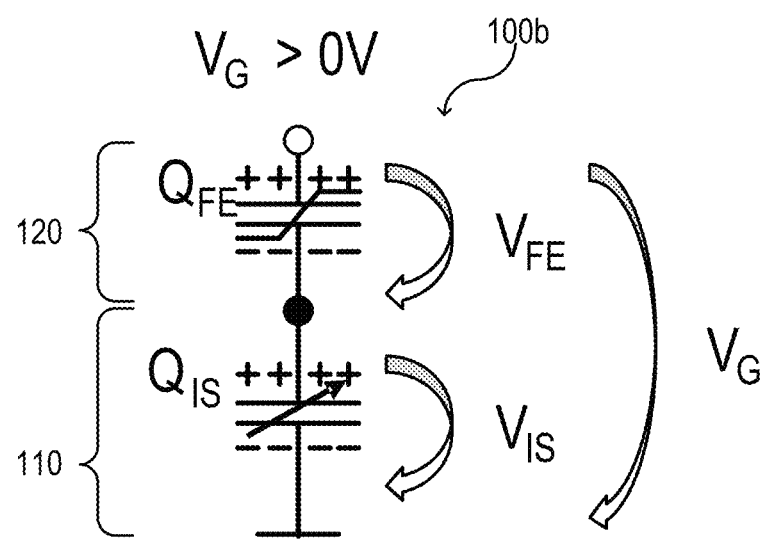

FIG. 1B illustrates an equivalent circuit 100b associated with a FeFET stack of a FeFET based memory cell, e.g., of the memory cell 100. A first capacitor structure 120 is associated with the gate-electrode 128 and with the remanent-polarizable layer 118r of the gate-isolation 118. A second capacitor structure 110 is associated with the one or more electrically insulating layers 118i of the gate-isolation 118 and with the channel 106 and/or the semiconductor bulk region 101b.

The first capacitor structure 120 may have a first capacitance, $C_{FE}$, a first charge, $Q_{FE}$, and a first voltage, $V_{FE}$, associated therewith. The second capacitor structure 110 may have a second capacitance, $C_{IS}$, a second charge, $Q_{IS}$, and a second voltage, $V_{IS}$, associated therewith. The voltage drop of the series connection of the two capacitor structures 110, 120 may be referred to as gate voltage, $V_G$. In this example, the gate voltage, $V_G$, is a positive voltage (greater than 0 V); however, the gate voltage may be a negative voltage (less than 0 V) as well. The gate voltage, $V_G$, may be applied at the gate electrode and the channel 106 and/or the semiconductor bulk region 101b may be on a reference potential, e.g., on ground potential (also referred to as 0 V, or as VSS, as examples).

In some aspects, the first capacitance, $C_{FE}$, that is, for example, associated with a capacitive memory structure may not be constant, e.g., may be a function of the voltage that is applied and/or a function of a polarization of the material included in the capacitive memory structure. However, a so-called "dielectric" capacitance may be associated with the capacitive memory structure that is substantially constant and defines a minimal capacitance of the capacitive memory structure. The capacitance of a capacitive memory structure may be greater than the minimal capacitance in the case that the polarization of a remanent-polarizable layer that is included in the capacitive memory structure is polarized and/or switched by an external electrical field. In some aspects, the second capacitance, $C_{IS}$, that is, for example, associated with a portion of a field-effect transistor structure may not be constant, e.g., may be a function of the voltage that is applied. However, a so-called "dielectric" capacitance may be associated with the part of the field-effect transistor structure that is substantially constant and defines a maximal capacitance of the part of the field-effect transistor structure. The dielectric capacitance of a part of the field-effect transistor structure may be dominant in the case that the channel of the field-effect transistor structure is conductive, e.g., for strong accumulation and for strong inversion, and, otherwise, the capacitance of the field-effect transistor structure may be lower than the maximal capacitance.

According to general physical law, both charge neutrality (see Equation 1) and Kirchhoff law (see Equation 2) may be seen as fulfilled during all instances of an operation of the memory cell 100.

$$Q_{FE}=Q_{IS} \quad (1)$$

$$V_G=V_{FE}+V_{IS} \quad (2)$$

Figure 1C:
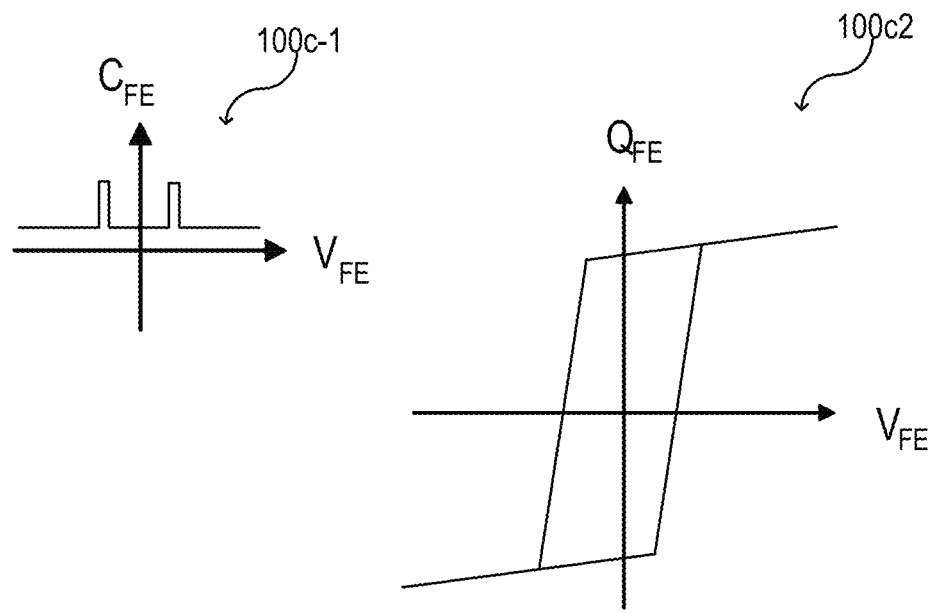

FIG. 1C shows a first diagram 100c-1 that illustrates a capacitance/voltage characteristic of the first capacitor structure 120 and a second diagram 100c-2 that illustrates a charge/voltage characteristic of the first capacitor structure 120, according to various aspects. The capacitance/voltage characteristic of the first capacitor structure 120 shows the first capacitance, $C_{FE}$, as a function of the first voltage, $V_{FE}$, that are associated with the first capacitor structure 120. The charge/voltage characteristic of the first capacitor structure 120 shows the first charge, $Q_{FE}$, as a function of the first voltage, $V_{FE}$, that are associated with the first capacitor structure 120.

Figure 1D:
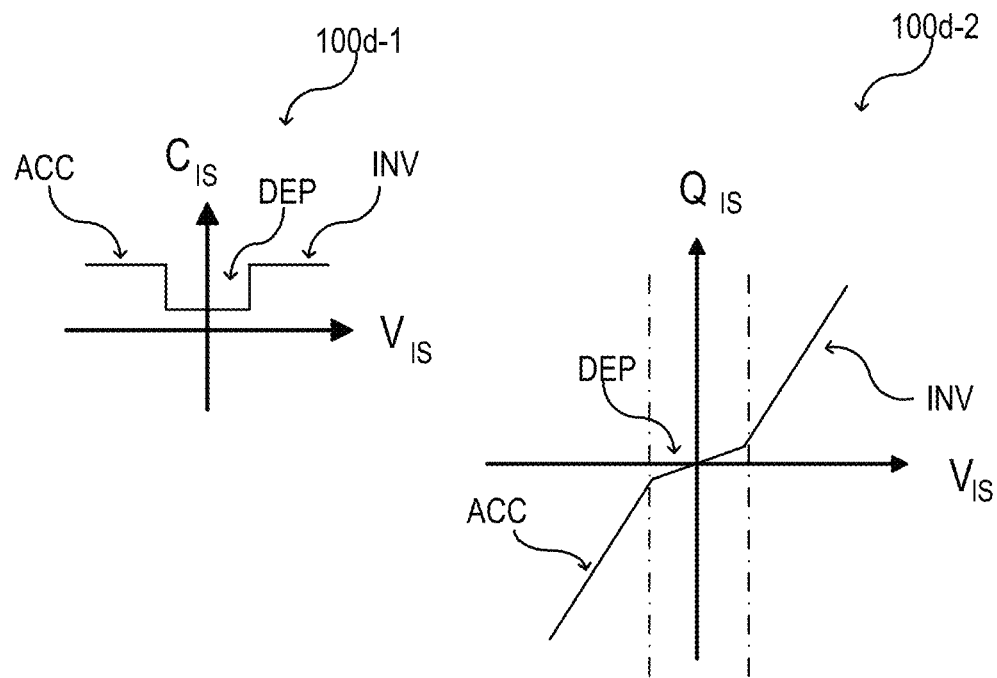

FIG. 1D shows a first diagram 100d-1 that illustrates a capacitance/voltage characteristic of the second capacitor structure 110 and a second diagram 100d-2 that illustrates a charge/voltage characteristic of the second capacitor structure 110, according to various aspects. The capacitance/voltage characteristic of the second capacitor structure 110 shows the second capacitance, $C_{IS}$, as a function of the second voltage, $V_{is}$, that are associated with the second capacitor structure 110. The charge/voltage characteristic of the second capacitor structure 110 shows the second charge, $Q_{IS}$ as a function of the second voltage, $V_{IS}$ that are associated with the second capacitor structure 110. Both diagrams 100d-1, 100d-2 illustrate the respective dependencies for three cases, namely, accumulation (ACC), depletion (DEP), and inversion (INV).

Figure 1E:
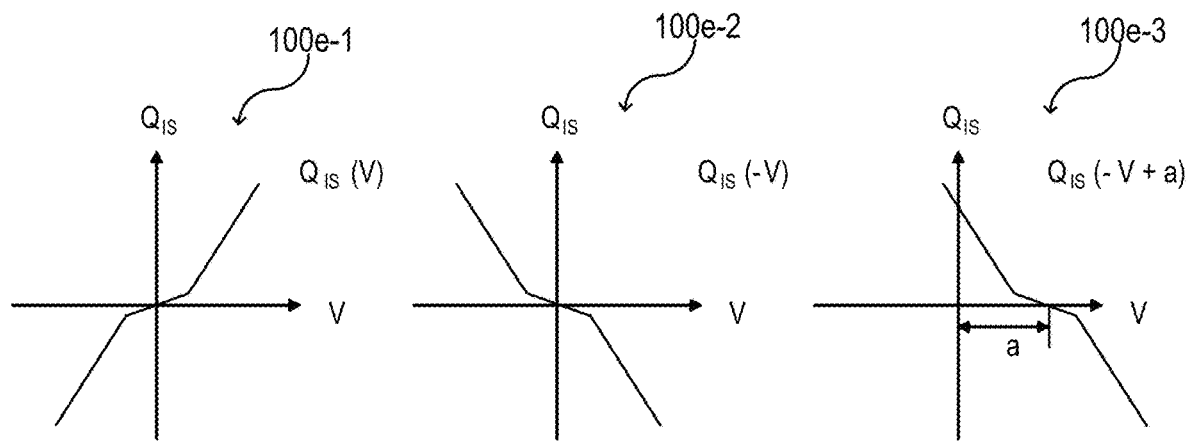

FIG. 1E shows three diagrams 100e-1, 100e-2, 100e-3 that illustrate basic characteristics of a charge/voltage characteristic, e.g., the charge/voltage characteristic of the second capacitor structure 110, according to various aspects. From equations (1) and (2) the following two related equations can be derived by simple math:

$$Q_{FE}(V_{FE})=Q_{IS}(V_{IS}) \quad (1a)$$

and $$V_{IS}=V_G-V_{FE} \quad (2a);$$

and by inserting equation (2a) into (1a), the following equation can be derived by simple math:

$$Q_{FE}(V_{FE})=Q_{IS}(V_G-V_{FE})=Q_{IS}(V_{FE}+V_G) \quad (3).$$

This approach may lead to a possibility to graphically solve equations (1a) and (2a). The graphical solution is shown schematically in a diagram 100f in FIG. 1F to illustrate aspects of depolarization in a gate stack including a remanent-polarizable material, according to various aspects.

Figure 1F:
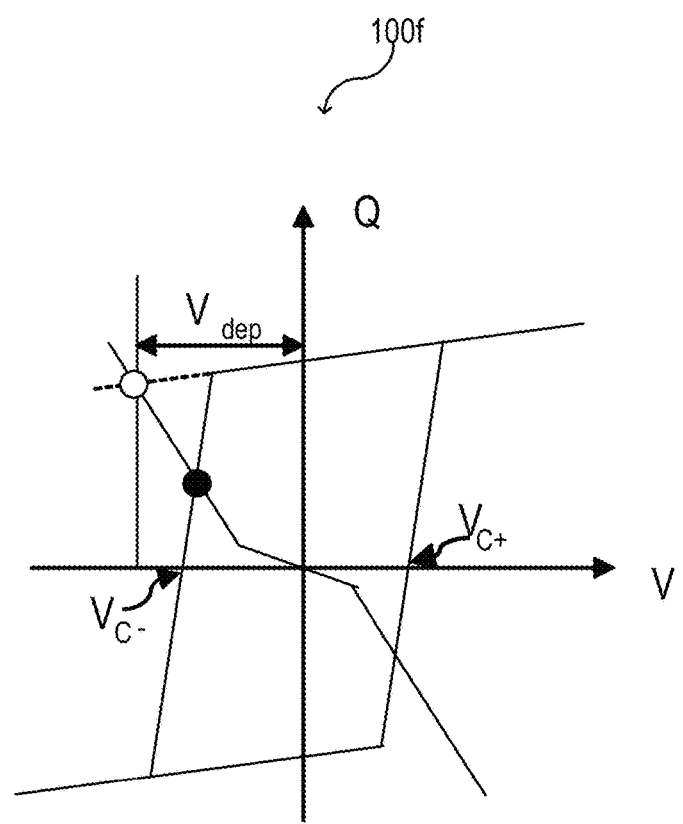

Due to the finite capacitance of the second capacitor structure 110, it may be the case that a comparatively large depolarization voltage and therefore a comparatively large depolarization field is created across the one or more remanent-polarizable layers 118r. In this exemplary case, the depolarization voltage may be $V_{dep}=V_{FE}=-V_{IS}$ and the depolarization field may be $(V_{dep}/t_{FE})$, wherein $t_{FE}$ is the thickness of the one or more remanent-polarizable layers 118r. In some cases, the depolarization field may be greater than the coercive field, that may be $(V_C/t_{FE})$, wherein $V_C$ is the coercive voltage. Therefore, in some aspects, the polarization of the one or more remanent-polarizable layers 118r may flip (e.g., completely or at least partially, as shown in FIG. 1F) into the opposite polarization state. However, a reduction of the remanent polarization and/or a flip of the polarization state may be undesired since it may affect data retention.

It is noted that the aspects described herein with reference to a planar field-effect transistor structure may apply in the same or in a similar way to field-effect transistor structures with other designs, e.g., fin field-effect transistor structures, trench field-effect transistor structures, or any other type of field-effect transistor structure.

According to various aspects, measures may be provided to reduce the depolarization field, e.g., in order to avoid data retention loss or in order to improve data retention, as described in more detail below. According to various aspects, a device structure for a memory cell is described to reduce the depolarization field in FeFET based devices, e.g., in a FeFET based memory cell.

According to various aspects, one or more charge trapping layers may be included in a gate stack of the FeFET based memory cell. According to various aspects, a layer stack is described that allows for storing information predominantly by a polarization state of one or more remanent-polarizable layers, wherein the retention is enhanced via utilizing one or more charge trapping layers to trap charges. The one or more charge trapping layers are configured to stabilize the polarization state of the one or more remanent-polarizable layers. Even though there are charges trapped within one or more charge storage layers, the memory state of the memory cell is not defined by this trapped charges. In other words, the polarity and/or the amount of trapped charges may not characterize the memory state of the memory cell.

Figure 2A:
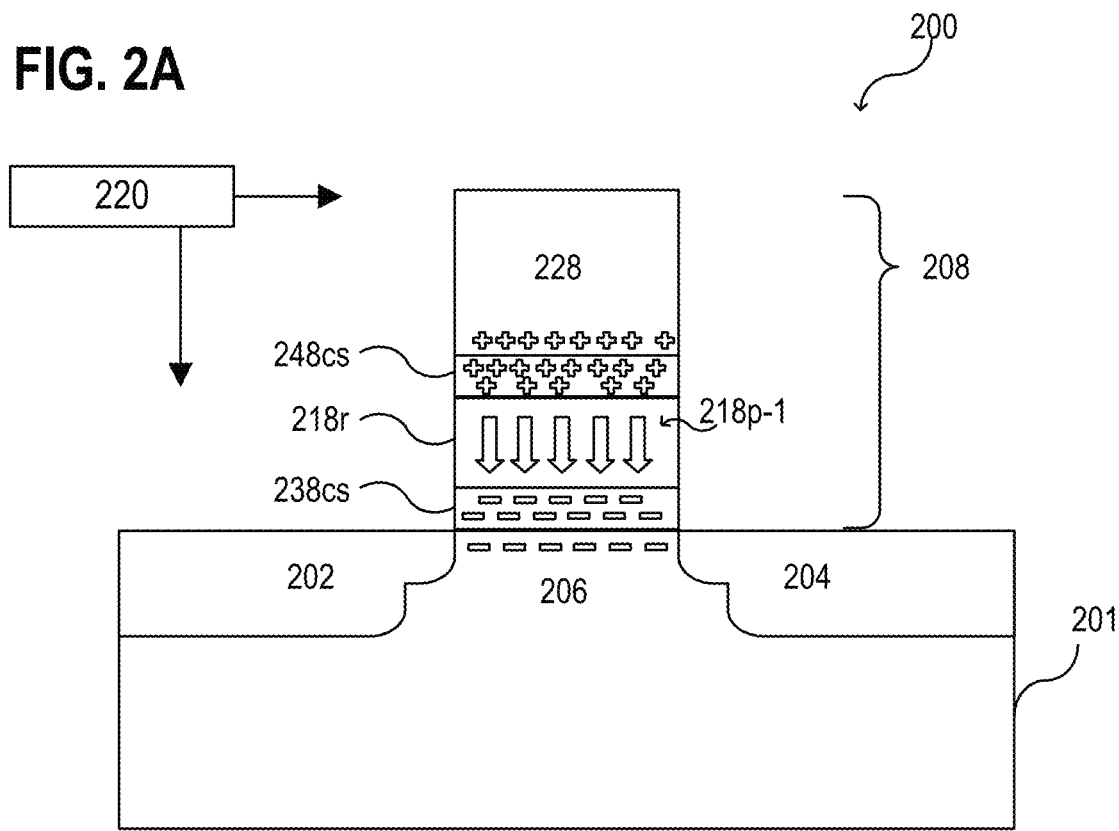
FIGS. 2A and 2B schematically show a memory cell, according to various aspects.
Figure 2B:
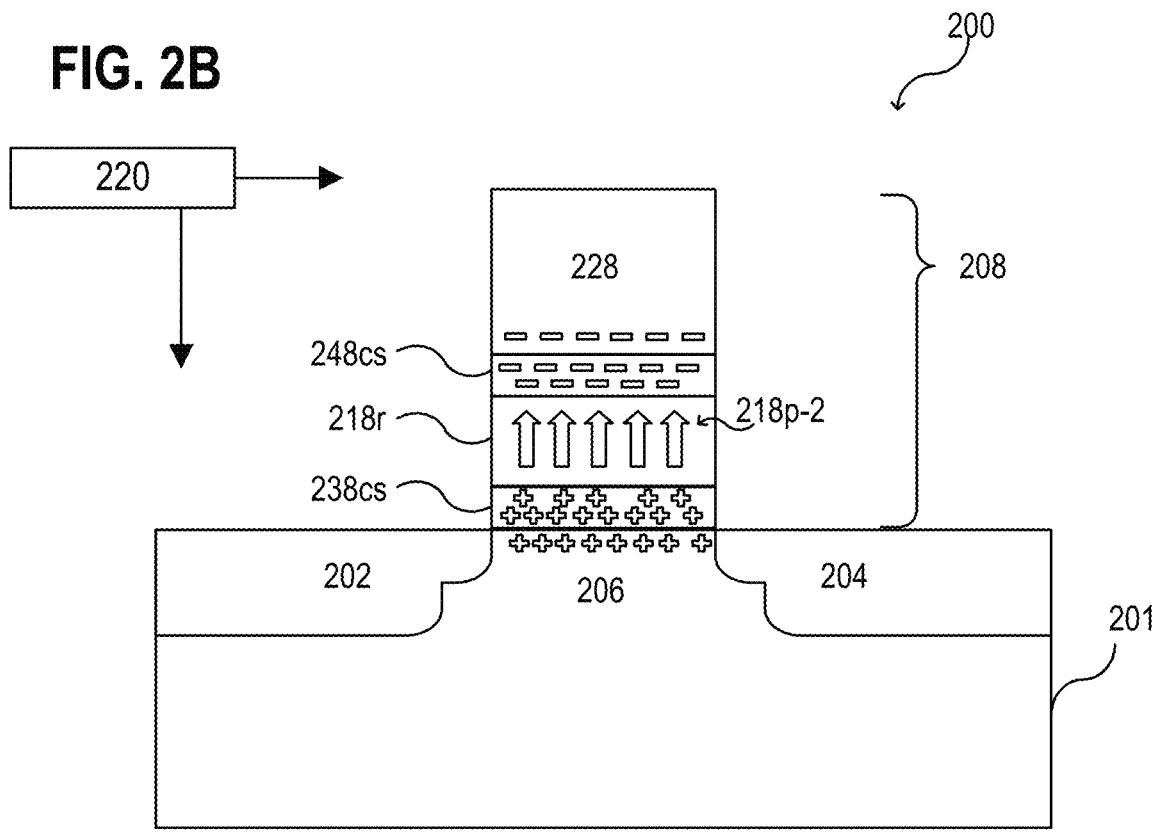

FIG. 2A and FIG. 2B illustrate schematically a memory cell 200, according to various aspects. According to various aspects, the memory cell 200 may be configured as a field-effect transistor (FET) based memory cell. The field-effect transistor function may be provided by any suitable design, e.g., via a channel 206, a first source/drain region 202, a second source/drain region 204, and a gate structure 208 disposed adjacent to the channel 206. The channel 206 may be provided by one or more semiconductor portions, e.g., within a bulk region of semiconductor substrate 201 or within a semiconductor layer, only as examples. The gate structure 208 may include one or more remanent-polarizable layers 218r. A gate structure 208 of a field-effect transistor based memory cell that includes one or more remanent-polarizable layers 218r may be also referred to as a FeFET gate stack. The gate structure 208 may further include a gate-electrode 228. The channel 206, the first source/drain region 202, the second source/drain region 204, the one or more remanent-polarizable layers 218r, and the gate-electrode 228 may be configured as described above with reference to FIG. 1A.

According to various aspects, the one or more remanent-polarizable layers 218r may be selectively switched into one of at least two memory states. FIG. 2A shows the memory cell 200 with the one or more remanent-polarizable layers 218r being in a first memory state 218p-1, e.g., in a first polarization state; and FIG. 2B shows the memory cell 200 with the one or more remanent-polarizable layers 218r being in a second memory state 218p-2, e.g., in a second polarization state. According to various aspects, the gate structure 208 may further include one or more charge storage structures 238cs, 248cs. In some aspects, the one or more charge storage structures 238cs, 248cs may be configured to increase retention of the memory cell 200, e.g., the one or more charge storage structures 238cs, 248cs may be configured to prevent or reduce depolarization of the one or more remanent-polarizable layers 218r of the FeFET gate stack.

The gate structure 208 of the memory cell 200 may be configured to from a series connection of two capacitor structures, as described with respect to the first capacitor structure 120 and the second capacitor structure 110 with reference to FIGS. 1B to 1F. The series connection of the two capacitor structures may be formed by the channel 206, the one or more charge storage structures 238cs, 248cs, the one or more remanent-polarizable layers 218r, and the gate electrode 228.

In view of the aspects described above with respect to the series connection of capacitor structures with reference to FIGS. 1B to 1F, the one or more charge storage structures 238cs, 248cs may change the charge voltage characteristics associated with the memory cell 200, as described in more detail below.

Figure 2C:
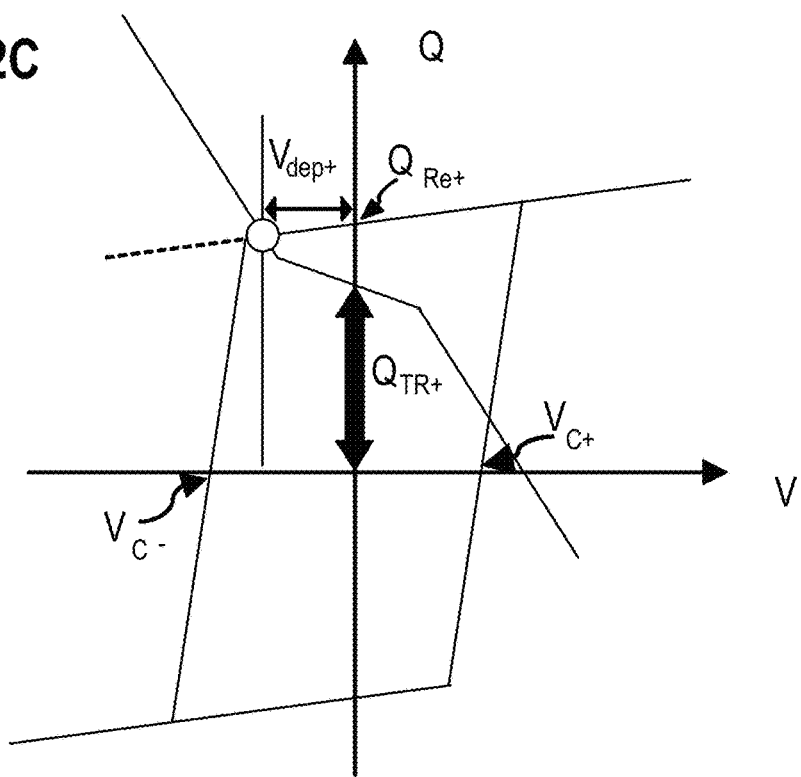
FIGS. 2C and 2D schematically show electrical properties associated with a memory cell, according to various aspects.
Figure 2D:
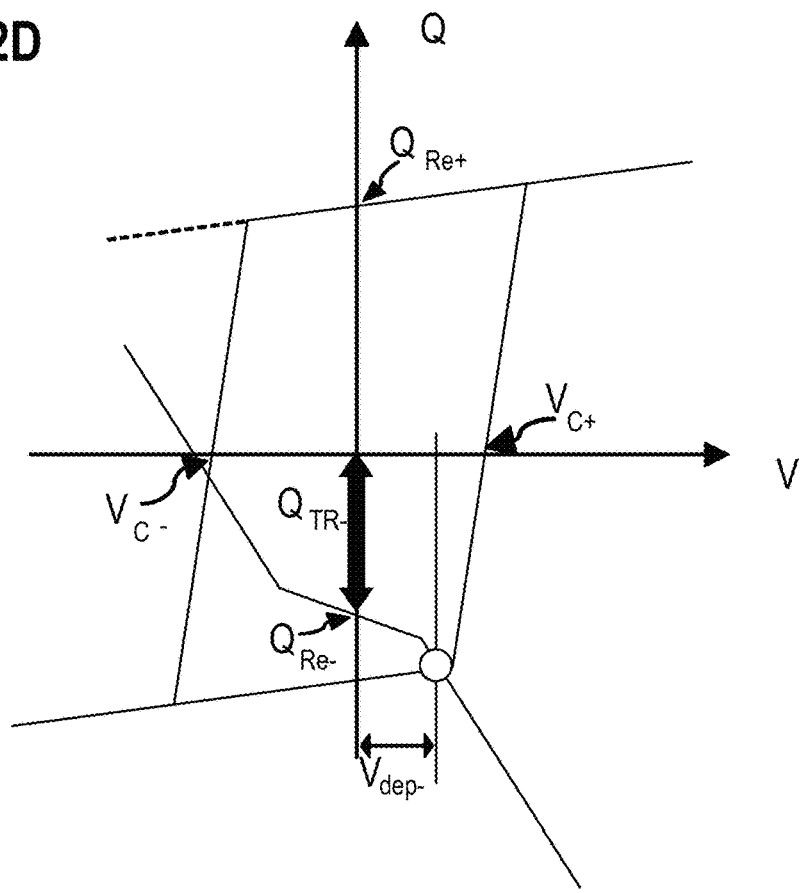

FIG. 2C shows a diagram 200a illustrating the charge voltage characteristics of the memory cell 200 a after applying positive electric field across the FeFET gate stack, e.g., after a program operation may be carried out to bring the memory cell 200 in a first memory state, e.g., defined by the first polarization state 218p-1 of the one or more remanent-polarizable layers 218r. FIG. 2D shows a diagram 200b illustrating the charge voltage characteristics of the memory cell 200 a after applying negative electric field across the FeFET gate stack, e.g., after an erase operation may be carried out to bring the memory cell 200 in a second memory state, e.g., defined by the second polarization state 218p-2 of the one or more remanent-polarizable layers 218r.

Due to the charge, $Q_{TR}$, that is trapped in the one or more charge storage structures 238cs, 248cs, the depolarization voltage, $V_{dep}$, may decrease (with respect to its absolute voltage) and therefore the depolarization field ($V_{dep}/t_{FE}$) may decrease compared to a FeFET gate stack with no charges trapped therein, cf. FIG. 1F. Thus, according to various aspects, the depolarization voltage, $V_{dep}$, may be less than the corresponding coercive voltage, $V_C$, with respect to their absolute values ($|V_{dep-}|=V_{FE}=-V_{IS}<|V_{C-}|$, $|V_{dep+}|=V_{FE}=-V_{IS}<|V_{C+}|$) and, accordingly, the depolarization field ($V_{dep}/t_{FE}$) may be less than the coercive field, that may be ($V_C/t_{FE}$) with respect to their absolute values. Accordingly, the respective polarization state 218p-1, 218p-2 of the one or more remanent-polarizable layers 218r is stabilized by the charge, $Q_{TR}$, trapped in the one or more charge storage structures 238cs, 248cs.

In the case that the one or more remanent-polarizable layers 218r of the memory cell 200 are switched into the first polarization state 218p-1, this first polarization state 218p-1 may be stabilized by corresponding first charge, $Q_{TR+}$, trapped in the one or more charge storage structures 238cs, 248cs. The trapped first charge, $Q_{TR+}$, may be less than (e.g., with respect to their absolute values) a first remanent charge, $Q_{Re+}$, that is stored in the one or more remanent-polarizable layers 218r. Therefore, the first memory state 218p-1 of the memory cell 200 may be defined by the first remanent charge, $Q_{Re+}$, and the trapped first charge, $Q_{TR+}$, may not dominate the properties (e.g., the electrical resistance of the channel 206) of the field-effect transistor structure.

In the case that the one or more remanent-polarizable layers 218r of the memory cell 200 are switched into the second polarization state 218p-2, this second polarization state 218p-2 may be stabilized by a corresponding second charge, $Q_{TR-}$, trapped in the one or more charge storage structures 238cs, 248cs. The trapped second charge, $Q_{TR-}$, may be less than (e.g., with respect to their absolute values) a second remanent charge, $Q_{Re-}$, that is stored in the one or more remanent-polarizable layers 218r. Therefore, the second memory state 218p-2 of the memory cell 200 may be defined by the second remanent charge, $Q_{Re-}$, and the trapped second charge, $Q_{TR-}$, may not dominate the properties (e.g., the electrical resistance of the channel 206) of the field-effect transistor structure.

According to various aspects, a FeFET is provided such that charges are injected into one or more charge storage structures that are formed adjacent to a remanent-polarizable memory element, e.g., adjacent to one or more remanent-polarizable layers. The injected charges support in screening the comparatively large ferroelectric polarization and in reducing the depolarization field to values less than the coercive field. Thereby data retention of both memory states can be stabilized.

According to various aspects, a first charge storage structure 238cs may be disposed at a first side of the one or more remanent-polarizable layers 218r, e.g., between the one or more remanent-polarizable layers 218r and the channel 206, and a second charge storage structure 238cs may be disposed at a second side of the one or more remanent-polarizable layers 218r opposite the first side, e.g., between the one or more remanent-polarizable layers 218r and the gate electrode 228. Even though a configuration with two charge storage structures 238cs, 248cs (e.g., one disposed over and the other one disposed below the one or more remanent-polarizable layers 218r) appears to be beneficial with respect to screening of the ferroelectric polarization, one of the two charge storage structures may be already sufficient to achieve the desired retention. Therefore, in some aspects, the memory cell 200 may include only a single charge storage structure 238cs disposed between the one or more remanent-polarizable layers 218r and the channel 206; or, in other aspects, the memory cell 200 may include only a single charge storage structure 248cs disposed between the one or more remanent-polarizable layers 218r and the gate electrode 228.

According to various aspects, the first charge storage structure 238cs and/or the second charge storage structure 248cs may include one or more charge storage layers or may consist of at least one charge storage layer. A charge storage layer may include or may consist of any material that allows for trapping a substantial amount of positive and negative charges. As basic materials, one or more of the following materials may be used to form a charge storage layer: $SiO_2$, SiN, SiON, HfSiON, $HfO_2$, only as examples.

According to various aspects, the first charge storage structure 238cs and/or the second charge storage structure 248cs may be each provided by a single charge storage layer. As an example, a single charge storage layer may be disposed between the one or more remanent-polarizable layers 218r and the channel 206 in direct physical contact with both of them. As another example, a single charge storage layer may be disposed between the one or more remanent-polarizable layers 218r and the gate electrode 228 in direct physical contact with both of them. As another example, a first single charge storage layer may be disposed between the one or more remanent-polarizable layers 218r and the channel 206 in direct physical contact with both of them and a second single charge storage layer may be disposed between the one or more remanent-polarizable layers 218r and the gate electrode 228 in direct physical contact with both of them. In this case, the respective single charge storage layer may include or may consist of an electrically insulating material to prevent a conductive discharge of the trapped charges into the channel 206 and/or into the gate electrode 228.

According to various aspects, the first charge storage structure 238cs and/or the second charge storage structure 248cs may be each provided by at least a charge storage layer and a tunnel layer. In this case, the respective charge storage layer may include or may consist of an electrically insulating material or an electrically conductive material. The respective tunnel layer may be configured to prevent a conductive discharge of the trapped charges into the channel 206 and/or into the gate electrode 228. In other words, the respective tunnel layer may be disposed between the respective charge storage layer and the channel 206 or the gate electrode 228 accordingly, as explained in more detail below.

As schematically illustrated in FIG. 2A and FIG. 2B, a control circuit 220 may be used (e.g., as part of a memory cell arrangement) to write the field-effect transistor based memory cell by providing a voltage that drops over the one or more remanent-polarizable layers and over the one or more charge storage structures such that a screening charge is stored in the one or more charge storage structures and such that the one or more remanent-polarizable layers are switched into a polarization state that defines the memory state of the memory cell.

Figure 3:
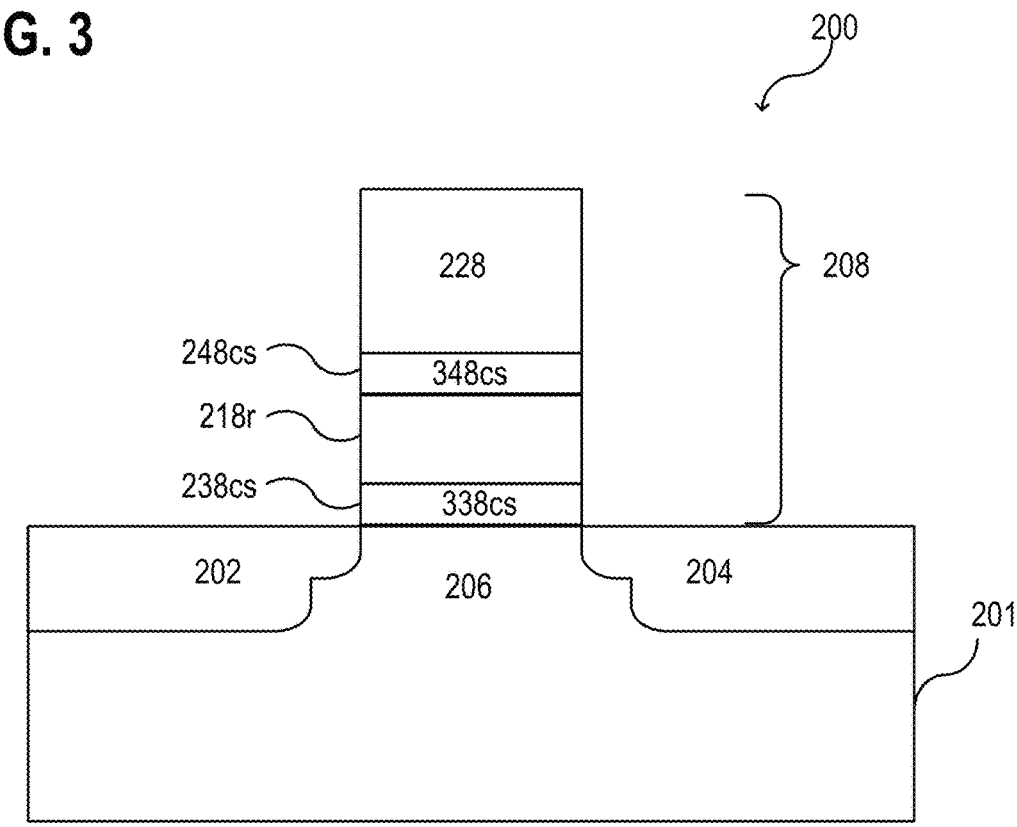
FIG. 3 schematically shows a memory cell, according to various aspects.

FIG. 3 shows the memory cell 200, wherein each of the charge storage structures include a single charge storage layer 338cs, 348cs. In this case, a first charge storage layer 338cs may be disposed between the one or more remanent-polarizable layers 218r and the channel 206 of the field-effect transistor structure of the memory cell 200. The first charge storage layer 338cs may have two functions in this configuration, namely, the first charge storage layer 338cs may be part of the gate isolation disposed between the channel 206 and the gate electrode, and the first charge storage layer 338cs may be used to trap charges to screen the polarization of the one or more remanent-polarizable layers 218r during operation of the memory cell 200. Further, a second charge storage layer 348cs may be disposed between the one or more remanent-polarizable layers 218r and the gate electrode 228 of the field-effect transistor structure of the memory cell 200. The second charge storage layer 348cs may have two functions in this configuration, namely, the second charge storage layer 348cs may be part of the gate isolation disposed between the channel 206 and the gate electrode, and the second charge storage layer 348cs may be used to trap charges to screen the polarization of the one or more remanent-polarizable layers 218r during operation of the memory cell 200.

According to various aspects, the first charge storage layer 338cs may be in direct physical contact with both the one or more remanent-polarizable layers 218r and the channel 206. The second charge storage layer 348cs may be in direct physical contact with both the one or more remanent-polarizable layers 218r and the gate electrode 228. The first charge storage layer 338cs and/or the second charge storage layer 348cs may include or may consist of any suitable electrically conductive or non-conductive material, e.g., $SiO_2$, SiN, SiON, HfSiON, $HfO_2$, Poly-Si, TiN, TaN, only as examples. According to various aspects, the layer thickness of the respective charge storage layer 338cs, 348cs may be selected to store a screening charge (in other words to trap a charge $Q_{TR}$) that is in a predefined range. The respective charge storage layer 338cs, 348cs may have a layer thickness in the range from about 0.1 nm to about 10 nm, e.g., in the range from about 0.1 nm to about 5 nm, e.g., in the range from about 0.1 nm to about 3 nm, e.g., in the range from about 0.1 nm to about 1 nm. In some aspects, the respective charge storage layer 338cs, 348cs may include or may consist of a single crystalline material and/or an epitaxial grown material. To increase the charges that can be trapped within such a layer, the defect density may be increased, e.g., via ion implantation or other suitable measures that may introduce defects in the crystal structure of the respective charge storage layer 338cs, 348cs. Alternatively, the respective charge storage layer 338cs, 348cs may include or may consist of a polycrystalline material that may have inherently more defects in the crystal structure than single crystalline material and/or an epitaxial grown material.

Figure 4:
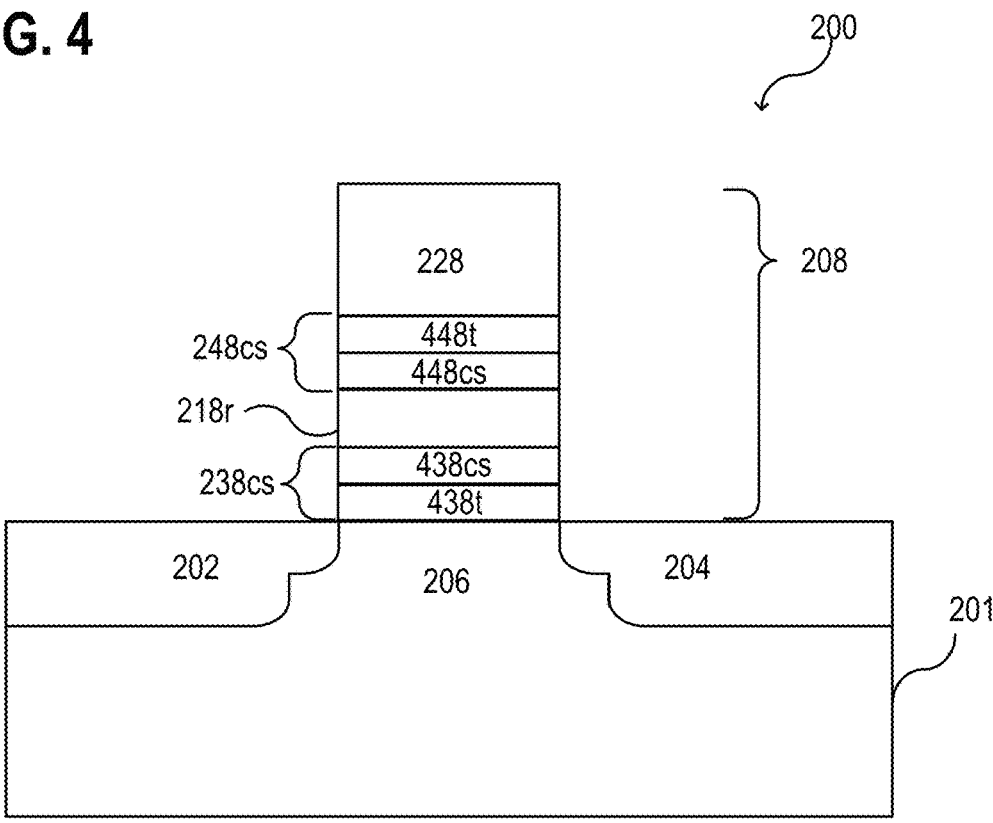
FIG. 4 schematically shows a memory cell, according to various aspects.

FIG. 4 shows the memory cell 200, wherein each of the charge storage structures include a charge storage layer 438cs, 448cs and a tunnel layer 438t, 448t.

According to various aspects, a first charge storage layer 438cs and a first tunnel layer 438t (e.g., that form the first charge storage structure 238cs or that are part of the first charge storage structure 238cs) may be disposed between the one or more remanent-polarizable layers 218r and the channel 206 of the field-effect transistor structure of the memory cell 200.

The first tunnel layer 438t may be disposed between the first charge storage layer 438cs and the channel 206. In some aspects, the first tunnel layer 438t may be in direct physical contact with both the first charge storage layer 438cs and the channel 206. The first tunnel layer 438t may include or may consist of any suitable electrically non-conductive (isolating) material, e.g., $SiO_2$, SiN, SiON, HfSiON, $HfO_2$, only as examples. In other aspects the first tunnel layer 438t may be configured as an electrically insulating layer stack, e.g., an oxide-nitride-oxide (ONO) layer stack. The first tunnel layer 438t may have a layer thickness in the range from about 0.1 nm to about 5 nm, e.g., in the range from about 0.1 nm to about 3 nm, e.g., in the range from about 0.1 nm to about 2 nm, e.g., in the range from about 0.1 nm to about 1 nm.

The first charge storage layer 438cs may include or may consist of any suitable electrically conductive or non-conductive material, e.g., $SiO_2$, SiN, SiON, HfSiON, $HfO_2$, Poly-Si, TiN, TaN, only as examples. According to various aspects, the layer thickness of the first charge storage layer 438cs may be selected to store a screening charge (in other words to trap a charge $Q_{TR}$) that is in a predefined range. The first charge storage layer 438cs may have a layer thickness in the range from about 0.1 nm to about 5 nm, e.g., in the range from about 0.1 nm to about 3 nm, e.g., in the range from about 0.1 nm to about 2 nm, e.g., in the range from about 0.1 nm to about 1 nm. In some aspects, the first charge storage layer 438cs may include or may consist of a single crystalline material and/or an epitaxial grown material. To increase the charges that can be trapped within such a layer, the defect density may be increased, e.g., via ion implantation or other suitable measures that may introduce defects in the crystal structure of the first charge storage layer 438cs. Alternatively, the first charge storage layer 438cs may include or may consist of a polycrystalline material that may have inherently more defects in the crystal structure than single crystalline material and/or an epitaxial grown material.

According to various aspects, a second charge storage layer 448cs and a second tunnel layer 448t (e.g., that form the second charge storage structure 248cs or that are part of the second charge storage structure 248cs) may be disposed between the one or more remanent-polarizable layers 218r and the gate electrode 228 of the field-effect transistor structure of the memory cell 100.

The second tunnel layer 448t may be disposed between the second charge storage layer 448cs and the gate electrode 228. In some aspects, the second tunnel layer 448t may be in direct physical contact with both the second charge storage layer 448cs and the gate electrode 228. The second tunnel layer 448t may include or may consist of any suitable electrically non-conductive (isolating) material, e.g., SiO2, SiN, SiON, HfSiON, HfO$_2$, only as examples. In other aspects the second tunnel layer 448t may be configured as an electrically insulating layer stack, e.g., an oxide-nitride-oxide (ONO) layer stack. The second tunnel layer 448t may have a layer thickness in the range from about 0.1 nm to about 5 nm, e.g., in the range from about 0.1 nm to about 3 nm, e.g., in the range from about 0.1 nm to about 2 nm, e.g., in the range from about 0.1 nm to about 1 nm.

The second charge storage layer 448cs may include or may consist of any suitable electrically conductive or non-conductive material, e.g., SiO2, SiN, SiON, HfSiON, HfO$_2$, Poly-Si, TiN, TaN, only as examples. According to various aspects, the layer thickness of the second charge storage layer 448cs may be selected to store a screening charge (in other words to trap a charge $Q_{TR}$) that is in a predefined range. The second charge storage layer 448cs may have a layer thickness in the range from about 0.1 nm to about 5 nm, e.g., in the range from about 0.1 nm to about 3 nm, e.g., in the range from about 0.1 nm to about 2 nm, e.g., in the range from about 0.1 nm to about 1 nm. In some aspects, the second charge storage layer 448cs may include or may consist of a single crystalline material and/or an epitaxial grown material. To increase the charges that can be trapped within such a layer, the defect density may be increased, e.g., via ion implantation or other suitable measures that may introduce defects in the crystal structure of the second charge storage layer 448cs. Alternatively, the second charge storage layer 448cs may include or may consist of a polycrystalline material that may have inherently more defects in the crystal structure than single crystalline material and/or an epitaxial grown material.

In some aspects, the gate stack 208 of the memory cell 200 may include, besides the gate electrode and the one or more remanent-polarizable layers 218r, only the first charge storage structure 238cs configured as a single charge trapping layer or as a layer stack including at least a charge trapping layer and a tunnel layer. In some aspects, the gate stack 208 of the memory cell 200 may include, besides the gate electrode and the one or more remanent-polarizable layers 218r, only the second charge storage structure 248cs configured as a single charge trapping layer or as a layer stack including at least a charge trapping layer and a tunnel layer. In other aspects, the gate stack 208 of the memory cell 200 may include, besides the gate electrode and the one or more remanent-polarizable layers 218r, combinations of the described charge storage structures 238cs, 248cs; e.g., the gate stack 208 may include the first charge storage structure 238cs configured as a single charge trapping layer and the second charge storage structure 248cs configured as a single charge trapping layer; or the gate stack 208 may include the first charge storage structure 238cs configured as a single charge trapping layer and the second charge storage structure 248cs configured as a layer stack including at least a charge trapping layer and a tunnel layer; or the gate stack 208 may include the first charge storage structure 238cs configured as a layer stack including at least a charge trapping layer and a tunnel layer and the second charge storage structure 248cs configured as a single charge trapping layer; or the gate stack 208 may include the first charge storage structure 238cs configured as a layer stack including at least a charge trapping layer and a tunnel layer and the second charge storage structure 248cs configured as a layer stack including at least a charge trapping layer and a tunnel layer.

According to various aspects, each of the charge storage structures 238cs, 248cs may be configured to store at least a charge such that a charge density in the respective charge storage structure 238cs, 248cs is in the range from about 0.1 nC/cm$^2$ to about 100 µC/cm$^2$. The respective charge storage structure 238cs, 248cs may be configured to maintain a charge (that results in a charge density of at least 0.1 nC/cm$^2$) for at least one day.

According to various aspects, the layer thickness of the one or more remanent-polarizable layers 218r may be in the range from about 1 nm to about 50 nm. According to various aspects, the one or more remanent-polarizable layers 218r may be configured to have, in a first and/or in a second polarization state, a remanent charge that is greater than the charge stored in each of the respective charge storage structure 238cs, 248cs. According to various aspects, the one or more remanent-polarizable layers 218r may be configured to have, in a first and/or in a second polarization state, a remanent charge that results in a charge density that is greater than a charge density associated with the charge stored in each of the respective charge storage structure 238cs, 248cs.

According to various aspects, a remanent-polarizable FET is provided that may include at least one charge storage layer neighboring a remanent polarizable layer in order to reduce the depolarization field in the gate stack. According to various aspects, a remanent-polarizable FET is provided that may include one charge storage layer disposed above a remanent-polarizable layer and one charge storage layer disposed below the remanent-polarizable layer. The charge storage layers do not necessarily have to be of the same material, the same dimensions (e.g., thickness), and/or of the same microstructure.

According to various aspects, a remanent-polarizable FET is provided that may include exactly one charge storage layer either above a remanent-polarizable layer or below the remanent-polarizable layer.

According to various aspects, a remanent-polarizable FET is provided that may include at least one charge storage layer and a tunnel layer neighboring the remanent-polarizable layer to reduce the depolarization field in the gate stack.

According to various aspects, a remanent-polarizable FET is provided that may include one charge storage layer and a tunnel layer disposed above the remanent-polarizable layer and one charge storage layer and a tunnel layer disposed below the remanent-polarizable layer. The charge storage layers and tunnel layers do not necessarily have to be of the same material, the same dimensions (e.g., thickness), and/or of the same microstructure.

According to various aspects, a remanent-polarizable FET is provided that may include exactly one charge storage layer and exactly one tunnel layer either disposed above the remanent-polarizable layer or disposed below the remanent-polarizable layer.

According to various aspects, a charge storage layer may be an electrically conductive layer that can be charged in the same way as a capacitor electrode can be charged. An additional tunnel layer may allow to keep the charge stored for a longer time in the charge storage layer (e.g., for days, weeks, or years) without actively applying any voltages.

According to various aspects, a charge storage layer may be an electrically insulating layer that has a substantive charge trap capability. The charge trap capability may be a function of the defect density of the material that forms the charge storage layer. According to various aspects, a charge storage layer may include a material with a defect density, $D_o$, greater than 0.5 cm$^{-2}$, e.g., greater than 1 cm$^{-2}$, e.g., greater than 5 cm$^{-2}$. It is noted that, in general, a gate isolation layer disposed in a gate stack of a field-effect transistor may be particularly designed to have a possibly low defect density, e.g., less than 0.5 cm$^{-2}$, e.g., less than 0.1 cm$^{-2}$.

According to various aspects, with respect to the defect density, a charge storage layer may be a portion (e.g., a sublayer) of a base layer (e.g., a portion of a remanent-polarizable layer) that has a higher defect density as the base layer. In some aspects, a base layer (e.g., a portion of a remanent-polarizable layer) may be formed (e.g., grown by chemical vapor deposition or physical vapor deposition) such that a portion (e.g., a sublayer) of the base layer (e.g., a portion of a remanent-polarizable layer) has a higher defect density than the rest of the base layer. In this case, the portion (e.g., the sublayer) acts as a charge trap layer or, in other words, as a charge storage layer, wherein the rest of the base layer may have another function (e.g., may serve as a remanent-polarizable layer).

Figure 5:
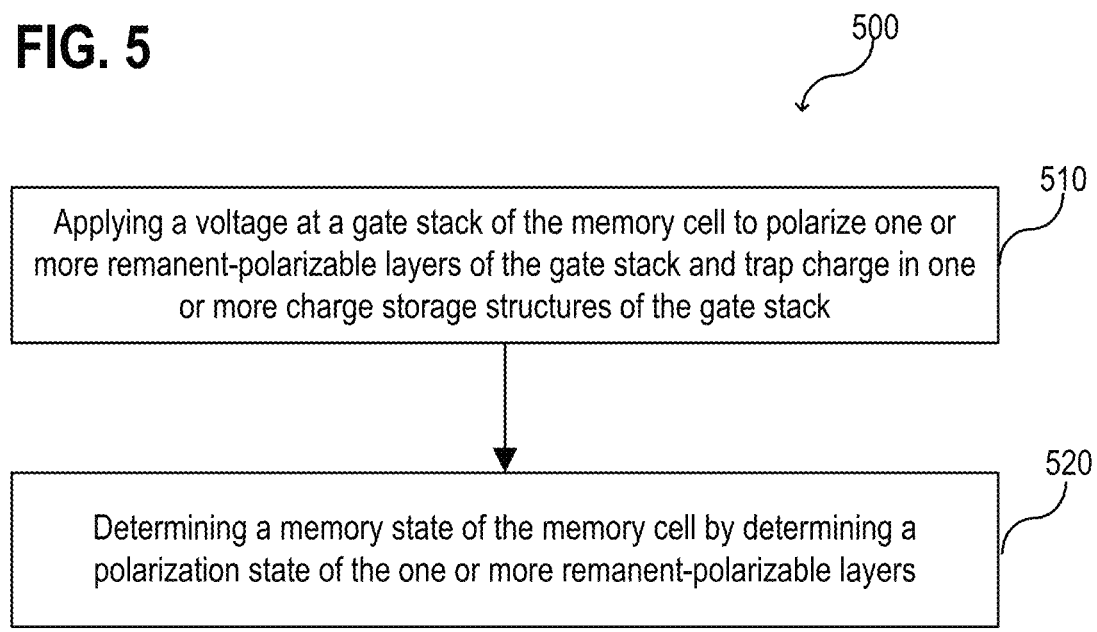
FIG. 5 shows a schematic flow diagram of a method for operating a memory cell, according to various aspects.

FIG. 5 shows a schematic flow diagram of a method 500 for operating a memory cell, according to various aspects. The method 500 may include: in 510, applying a gate voltage at a gate stack of the memory cell to polarize one or more remanent-polarizable layers of the gate stack and trap charge in one or more charge storage structures of the gate stack; and, in 520, determining a memory state of the memory cell by determining a polarization state of the one or more remanent-polarizable layers.

According to various aspects, the trapped charge may stabilize the polarization state of the one or more remanent-polarizable layers during a retention mode, wherein, in the retention mode, a reference voltage (e.g., 0 V, e.g., VSS) may be applied at all terminals (e.g., to the source/drain terminals and the gate terminal) of the memory cell.

According to various aspects, a gate voltage to write the memory cell 200, as described herein, may be in the range from about 1 V to about 10 V, e.g., the range from about 1 V to about 5 V, with respect to the absolute voltage value.

In the following, various examples are provided that may include one or more aspects described above with reference to a memory cell, a memory cell arrangement, or methods thereof. It may be intended that aspects described in relation to the memory cell may apply also to the memory cell arrangement and the method of operating the memory cell or the memory cell arrangement, and vice versa.

Example 1 is a memory cell, the memory cell including: a field-effect transistor structure, the field-effect transistor structure including a channel and a gate structure disposed adjacent to the channel. The gate structure including: one or more remanent-polarizable layers, a gate electrode, wherein the one or more remanent-polarizable layers are disposed between the gate electrode and the channel, and one or more charge storage structures disposed between at least one of the one or more remanent-polarizable layers and the channel and/or the one or more remanent-polarizable layers and the gate electrode.

In Example 2, the memory cell of example 1 may optionally further include that the one or more charge storage structures are configured to stabilize a polarization state associated with the one or more remanent-polarizable layers by trapping charge in the one or more charge storage structures.

In Example 3, the memory cell of example 2 may optionally further include that the polarization state associated with the one or more remanent-polarizable layers defines a memory state of the memory cell.

In Example 4, the memory cell of example 2 or 3 may optionally further include that a first polarization state associated with the one or more remanent-polarizable layers defines a first memory state of the memory cell and that a second polarization state associated with the one or more remanent-polarizable layers defines a second memory state of the memory cell.

In Example 5, the memory cell of any one of examples 1 to 4 may optionally further include that the one or more charge storage structures include at least a first charge storage structure disposed between the one or more remanent-polarizable layers and the channel, and that the one or more charge storage structures include at least a second charge storage structure disposed between the one or more remanent-polarizable layers and the gate electrode.

In Example 6, the memory cell of example 5 may optionally further include that the first charge storage structure includes at least a first charge storage layer; and that the second charge storage structure includes at least a second charge storage layer.

In Example 7, the memory cell of example 5 may optionally further include that the first charge storage structure includes at least a first charge storage layer and at least a first tunnel layer.

In Example 8, the memory cell of example 7 may optionally further include that the first tunnel layer is disposed between the first charge storage layer and the channel.

In Example 9, the memory cell of example 7 or 8 may optionally further include that the second charge storage structure includes at least a second charge storage layer and at least a second tunnel layer.

In Example 10, the memory cell of example 9 may optionally further include that the second tunnel layer is disposed between the second charge storage layer and the gate electrode.

In Example 11, the memory cell of any one of examples 1 to 4 may optionally further include that the one or more charge storage structures include only one charge storage structure disposed between the one or more remanent-polarizable layers and the channel.

In Example 12, the memory cell of example 11 may optionally further include that the charge storage structure includes at least a charge storage layer.

In Example 13, the memory cell of example 11 may optionally further include that the charge storage structure includes at least a charge storage layer and at least a tunnel layer.

In Example 14, the memory cell of example 13 may optionally further include that the tunnel layer is disposed between the charge storage layer and the channel.

In Example 15, the memory cell of any one of examples 1 to 4 may optionally further include that the one or more charge storage structures include only a charge storage structure disposed between the one or more remanent-polarizable layers and the gate electrode.

In Example 16, the memory cell of example 15 may optionally further include that the charge storage structure includes at least a charge storage layer.

In Example 17, the memory cell of example 15 may optionally further include that the charge storage structure includes at least a charge storage layer and at least a tunnel layer.

In Example 18, the memory cell of example 17 may optionally further include that the tunnel layer is disposed between the charge storage layer and the gate electrode.

In Example 19, the memory cell of any one of examples 1 to 4 may optionally further include that each of the one or more charge storage structures includes a charge storage layer and a tunnel layer.

In Example 20, the memory cell of example 19 may optionally further include that the charge storage layer includes an electrically conductive material.

In Example 21, the memory cell of example 19 or 20 may optionally further include that the tunnel layer includes an electrically isolating material and is in direct physical contact with the charge storage layer.

In Example 22, the memory cell of example 21 may optionally further include that the charge storage layer is disposed between the tunnel layer and the one or more remanent-polarizable layers.

In Example 23, the memory cell of any one of examples 1 to 22 may optionally further include that the channel includes a semiconductor material.

In Example 24, the memory cell of any one of examples 1 to 23 may optionally further include that the gate electrode includes one or more electrically conductive layers.

In Example 25, the memory cell of any one of examples 1 to 24 may optionally further include that the one or more remanent-polarizable layers and the one or more charge storage structures are configured as s gate isolation that isolates the gate electrode from the channel.

In Example 26, the memory cell of any one of examples 1 to 25 may optionally further include that the one or more charge storage structures are configured to store a screening charge that is in a predefined range. In this case, the memory state of the memory cell may be defined by the polarization state of the one or more remanent-polarizable layers. In this case, the memory state of the memory cell may be dominated by the polarization state of the one or more remanent-polarizable layers.

In Example 27, the memory cell of example 26 may optionally further include that the screening charge is less than a remanent charge associated with a polarization state of the one or more remanent-polarizable layers.

In Example 28, the memory cell of any one of examples 1 to 27 may optionally further include that the one or more charge storage structures are configured to store a first screening charge in the case that the one or more remanent-polarizable layers are in a first polarization state.

In Example 29, the memory cell of any one of examples 1 to 28 may optionally further include that the one or more charge storage structures are configured to store a second screening charge in the case that the one or more remanent-polarizable layers are in a second polarization state.

In Example 30, the memory cell of examples 28 and 29 may optionally further include that the first screening charge generates a first electric screening field and that the second screening charge generates a second electric screening field, wherein the first electric screening field and the second electric screening field are oriented anti-parallel to one another.

In Example 31, the memory cell of examples 28 and 29 may optionally further include that the first screening charge differs from the screening charge with respect to the absolute value and/or with respect to the polarity. According to various aspects, a charge storage layer or a charge storage structure as described herein may have negative charge (e.g., electrons) or positive charge (e.g., holes) stored therein.

In Example 32, the memory cell of any one of examples 1 to 31 may optionally further include that each of the one or more charge storage structures include at least one charge storage layer that has a defect density greater than a predefined value, e.g., greater than 0.5 $cm^{-2}$.

Example 33 is a memory cell arrangement, the memory cell arrangement including: a field-effect transistor based memory cell including a gate stack, the gate stack including: one or more remanent-polarizable layers, and one or more charge storage structures. The memory cell arrangement further including and a control circuit configured to write the field-effect transistor based memory cell by providing a voltage (e.g., a gate voltage) that drops over the one or more remanent-polarizable layers and over the one or more charge storage structures such that a screening charge is stored in the one or more charge storage structures and such that the one or more remanent-polarizable layers are switched into a polarization state that defines the memory state of the memory cell.

In Example 34, the memory cell arrangement of example 33 may optionally further include that at least one of the one or more charge storage structures is disposed on a side of the one or more remanent-polarizable layers that faces a gate electrode of the gate stack and/or that faces away from a channel of the field-effect transistor based memory cell.

Example 35 is a method for operating a memory cell, the method including: applying a gate voltage at a gate stack of the memory cell to polarize one or more remanent-polarizable layers of the gate stack and trap charge in one or more charge storage structures of the gate stack; and determining a memory state of the memory cell by determining a polarization state of the one or more remanent-polarizable layers. The trapped charge may stabilize the polarization state of the one or more remanent-polarizable layers during a retention mode. In the retention mode, a reference voltage (e.g., VSS, e.g., 0 V) may be applied at all terminals of the memory cell. In the retention mode, or one or more or all terminals of the memory cell may be kept floating.

It is noted that one or more functions described herein with reference to a memory cell, a remanent polarizable layer, a memory cell arrangement, etc. may be accordingly part of a method, e.g. part of a method for operating a memory cell arrangement. Vice versa, one or more functions described herein with reference to a method, e.g. with reference to a method for operating a memory cell arrangement, may be implemented accordingly in a device or in a part of a device, for example, in a remanent polarizable layer, a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. Memory cell comprising:
a field-effect transistor structure comprising a channel and a gate structure disposed adjacent to the channel, the gate structure comprising:
one or more remanent-polarizable layers,
a gate electrode, wherein the one or more remanent-polarizable layers are disposed between the gate electrode and the channel, and
one or more charge storage structures disposed between the channel and the gate electrode, the one or more charge storage structures are configured to stabilize a polarization state associated with the one or more remanent-polarizable layers by trapping charge in the one or more charge storage structures.

2. Memory cell of claim 1,
wherein the one or more charge storage structures comprise at least a first charge storage structure disposed between the one or more remanent-polarizable layers and the channel, and
wherein the one or more charge storage structures comprise at least a second charge storage structure disposed between the one or more remanent-polarizable layers and the gate electrode.

3. Memory cell of claim 2,
wherein the first charge storage structure comprises at least a first charge storage layer; and
wherein the second charge storage structure comprises at least a second charge storage layer.

4. Memory cell of claim 2,
wherein the first charge storage structure comprises at least a first charge storage layer and at least a first tunnel layer, wherein the first tunnel layer is disposed between the first charge storage layer and the channel; and
wherein the second charge storage structure comprises at least a second charge storage layer and at least a second tunnel layer, wherein the second tunnel layer is disposed between the second charge storage layer and the gate electrode.

5. Memory cell of claim 1,
wherein the one or more charge storage structures comprise only one charge storage structure disposed between the one or more remanent-polarizable layers and the channel.

6. Memory cell of claim 5,
wherein the charge storage structure comprises at least a charge storage layer.

7. Memory cell of claim 5,
wherein the charge storage structure comprises at least a charge storage layer and at least a tunnel layer, wherein the tunnel layer is disposed between the charge storage layer and the channel.

8. Memory cell of claim 1,
wherein the one or more charge storage structures comprise only a charge storage structure disposed between the one or more remanent-polarizable layers and the gate electrode.

9. Memory cell of claim 8,
wherein the charge storage structure comprises at least a charge storage layer.

10. Memory cell of claim 8,
wherein the charge storage structure comprises at least a charge storage layer and at least a tunnel layer, wherein the tunnel layer is disposed between the charge storage layer and the gate electrode.

11. Memory cell of claim 1,
wherein each of the one or more charge storage structures comprises a charge storage layer and a tunnel layer, wherein the charge storage layer comprises an electrically conductive material.

12. Memory cell of claim 11,
wherein the tunnel layer comprises an electrically isolating material and is in direct physical contact with the charge storage layer, wherein the charge storage layer is disposed between the tunnel layer and the one or more remanent-polarizable layers.

13. Memory cell of claim 1,
wherein the channel comprises semiconductor material,
wherein the gate electrode comprises one or more electrically conductive layers, and
wherein the one or more remanent-polarizable layers and the one or more charge storage structures are configured as gate isolation that isolates the gate electrode from the channel.

14. Memory cell of claim 1,
wherein the one or more charge storage structures are configured to store a screening charge that is in a predefined range so that the memory state of the memory cell is defined by the polarization state of the one or more remanent-polarizable layers.

15. Memory cell of claim 14,
wherein the screening charge is less than a remanent charge associated with a polarization state of the one or more remanent-polarizable layers.

16. Memory cell of claim 1,
wherein the one or more charge storage structures are configured to store a first screening charge in the case that the one or more remanent-polarizable layers are in a first polarization state and to store a second screening charge in the case that the one or more remanent-polarizable layers are in a second polarization state, wherein the first screening charge generates a first electric screening field and wherein the second screening charge generates a second electric screening field, where first electric screening field and the second electric screening field are oriented anti-parallel to one another.

17. Memory cell arrangement comprising:
a field-effect transistor based memory cell comprising a gate stack, the gate stack comprising:
one or more remanent-polarizable layers, and
one or more charge storage structures; and
a control circuit configured to write the field-effect transistor based memory cell by providing a voltage that drops over the one or more remanent-polarizable layers and over the one or more charge storage structures such that a screening charge is stored in the one or more charge storage structures and such that the one or more remanent-polarizable layers are switched into a polarization state that defines the memory state of the memory cell.

18. Memory cell arrangement of claim 17,
wherein at least one of the one or more charge storage structures is disposed on a side of the one or more remanent-polarizable layers that faces a gate electrode of the gate stack and/or that faces away from a channel of the field-effect transistor based memory cell.

19. Method for operating a memory cell, the method comprising:
applying a gate voltage at a gate stack of the memory cell to polarize one or more remanent-polarizable layers of the gate stack and trap charge in one or more charge storage structures of the gate stack; and
determining a memory state of the memory cell by determining a polarization state of the one or more remanent-polarizable layers.

20. Method of claim 19,
wherein the trapped charge stabilizes the polarization state of the one or more remanent-polarizable layers during a retention mode,
wherein, in the retention mode, a reference voltage is applied at one or more or all terminals of the memory cell, or
wherein, in the retention mode, a reference voltage is applied at one or more or all terminals of the memory cell are kept floating.

\* \* \* \* \*